(12) United States Patent  
Jin

(10) Patent No.: US 9,117,902 B2  
(45) Date of Patent: Aug. 25, 2015

(54) DUAL TRENCH RECTIFIER AND METHOD FOR FORMING THE SAME

(71) Applicants: Chip Integration Tech. Co., Ltd., Zhubei, Hsinchu County (TW); Qinhai Jin, Zhubei (TW)

(72) Inventor: Qinhai Jin, Zhubei (TW)

(73) Assignee: CHIP INTEGRATION TECH. CO., LTD., Zhubei, Hsinchu County (TW)

( * ) Notice: Subject to any disclaimer, the term of this patent is extended or adjusted under 35 U.S.C. 154(b) by 0 days.

(21) Appl. No.: 13/956,474

(22) Filed: Aug. 1, 2013

(65) Prior Publication Data

US 2015/0035047 A1 Feb. 5, 2015

(51) Int. Cl.  
*H01L 29/78* (2006.01)

(52) U.S. Cl.  
CPC .................... *H01L 29/7827* (2013.01)

(58) Field of Classification Search  
CPC .................................... H01L 29/7827  
USPC ................................ 257/328–330  
See application file for complete search history.

(56) References Cited

U.S. PATENT DOCUMENTS

2005/0167742 A1* 8/2005 Challa et al. ............... 257/328

* cited by examiner

*Primary Examiner* — Tran Tran  
(74) *Attorney, Agent, or Firm* — McClure, Qualey & Rodack, LLP

(57) ABSTRACT

A structure of dual trench rectifier comprises of the following elements. A plurality of trenches are formed parallel in an n−epitaxial layer on an n+ semiconductor substrate and spaced with each other by a mesa. A plurality of recesses are formed on the mesas. Each the trench has a trench oxide layer formed on the sidewalls and bottom thereof, and a first poly silicon layer is filled therein to form MOS structures. Each the recess has a recess oxide layer formed on the sidewalls and bottom thereof, and a second poly silicon layer is filled therein to form MOS structures. A plurality of p type bodies are formed at two sides of the MOS structures in recesses. A top metal is formed above the semiconductor substrate for serving as an anode. A bottom metal is formed beneath the semiconductor substrate for serving as a cathode.

5 Claims, 19 Drawing Sheets

DUAL TRENCH RECTIFIER AND METHOD FOR FORMING THE SAME

FIELD OF THE INVENTION

The present invention relates to a semiconductor device, and more particularly to a new structure of dual trench rectifier diode and the method for forming the same.

BACKGROUND OF THE INVENTION

The Schottky diode is an important power device and is widely applied for power supply switch, motor control, telecom switch, industrial automation, electrical automation, etc., and several high speed power switches. The very important position of Schottky diode is due to its good performance. For instance, the leakage current of the Schottky diode at reverse bias is acceptable even though it is larger than that of typical PN type diodes; the forward voltage drop is low; the reverse recovery time ($t_{RR}$) is very short; and the resistance reaches about 250 voltages at reverse bias. However, the leakage current of Shottky diode is higher than that of PN type diodes, and the leakage current is unstable and increasing following the increasing reverse bias because the image charge potential barrier is lower. Another drawback is that the reliability of the metal-semiconductor junction is decreasing when temperature is increasing, thereby to lower the capability of Schottky diode bearing forward and reverse impulse.

There are many methods for manufacturing the dual trench rectifiers in prior art. One of them is a Taiwan patent application with serial number 101140637 proposed by the inventor of this application.

Referring to FIG. 1, the structure of a well known trench rectifier includes an active area 15A and an end area 15T. Several trenches are formed in the active area 15A of an n− epitaxy layer 105 on a heavy doped n+ semiconductor substrate 100. A trench oxide layer 10G is formed on the bottom and sidewalls of each trench. A polysilicon layer is then filled fully in the trenches. The mesas between two trenches are formed with p+ heavy doped areas 20, like two small ears hanging on the two upper sidewalls of the mesa adjacent to the trenches. A metal silicide 60 is formed on the polysilicon layer 40 and the mesas. A top metal layer 80 is formed for serving as an anode which connects the active area 15A and extends to cover a portion of the end area 15T. The end area 15T includes a big trench. An oxide layer 10, a sidewall polysilicon 40S and a trench gate oxide 10G are formed on the big trench. Another metal layer is formed on the lower surface of the heavy doped n+ semiconductor substrate 100 for serving as a cathode.

SUMMARY OF THE INVENTION

The present invention provides a new structure of dual trench MOS rectifier and the method for forming the same. First, a trench etching process is performed to form trenches in an n− epitaxial layer on a heavy doped n+ semiconductor substrate. Then, a thermal oxidation process is performed to form a trench oxide layer. After, a first polysilicon layer is deposited to fill fully and cover the trenches.

An etching back process or a chemical mechanical polishing (CMP) process is applied to remove the first polysilicon layer and the oxide layer over mesas. Then, a photoresist pattern is formed to define the locations of recesses, and an etching process is performed to form the recesses by using the photoresist pattern as an etching mask. After forming the recesses, the photoresist pattern is removed and a process for forming a recess oxide layer is performed. A second polysilicon layer is then deposited and etched back to remove the second polysilicon layer over the mesas.

An ion implanting procedure is applied to implant p type conductive ions into the mesas. After, the oxide layer on the mesas is removed, and a process for forming a top metal layer is performed.

In the second embodiment of the present invention, the steps before forming and etching back the second polysilicon layer are same as that in the first embodiment. Then, a photoresist pattern is formed to define rows of MOS structures and ion implanted areas. The photoresist pattern is applied as a mask to remove the exposed second polysilicon layer. After, a first ion implanting procedure is performed to implant p type conductive ions into the mesas. The oxide layer on the mesas is removed, and a procedure for forming the top metal layer is performed.

In the first embodiment of the present invention, the structure of the dual trench MOS rectifier is to form a plurality of trenches parallel in n− epitaxial layer on the heavy doped n+ semiconductor substrate, wherein each the trench includes the trench oxide layer formed on the bottom and sidewalls thereof The plurality of recesses are formed in the n− epitaxial layer of the mesas and are divided by the mesas, wherein the plurality of recesses includes the recess oxide layer formed on the bottom and sidewalls thereof A first polysilicon layer doped with a conductive impurity is formed to fill fully the trenches, and a second polysilicon layer doped with a conductive impurity is formed to fill fully the recesses. A plurality of p type bodies (ion implanted areas) are formed in the n− epitaxil layer below the mesas at two sides of the MOS structures. A top metal layer is blanketed to cover the first and second polysilicon layers, the p type ion implanted areas on the semiconductor substrate for serving as an anode, and a bottom metal layer is formed beneath the heavy doped n+ semiconductor substrate to serve as a cathode.

The structure disclosed in the second embodiment is similar to that illustrated in the first embodiment of the present invention. The difference is that the second polysilicon layer is formed in the recesses and overfilled to cover the mesas, thereby higher than the recess oxide layer on the first polysilicon layer of the trenches. The second polysilicon layer is patterned to form rows of MOS structures perpendicular to the trenches, wherein the MOS structures includes the second polysilicon layer, the recess oxide layer and the epitaxial layer. The p type bodies are formed in the n− epitaxial layer below the mesas adjacent to the MOS structures.

The present invention also discloses varied designs of the two above embodiments. In the varied designs, the p type bodies below the mesas further include two heavy doped n type conductive ion areas.

DESCRIPTION OF THE PREFERRED EMBODIMENT

Figure 1:
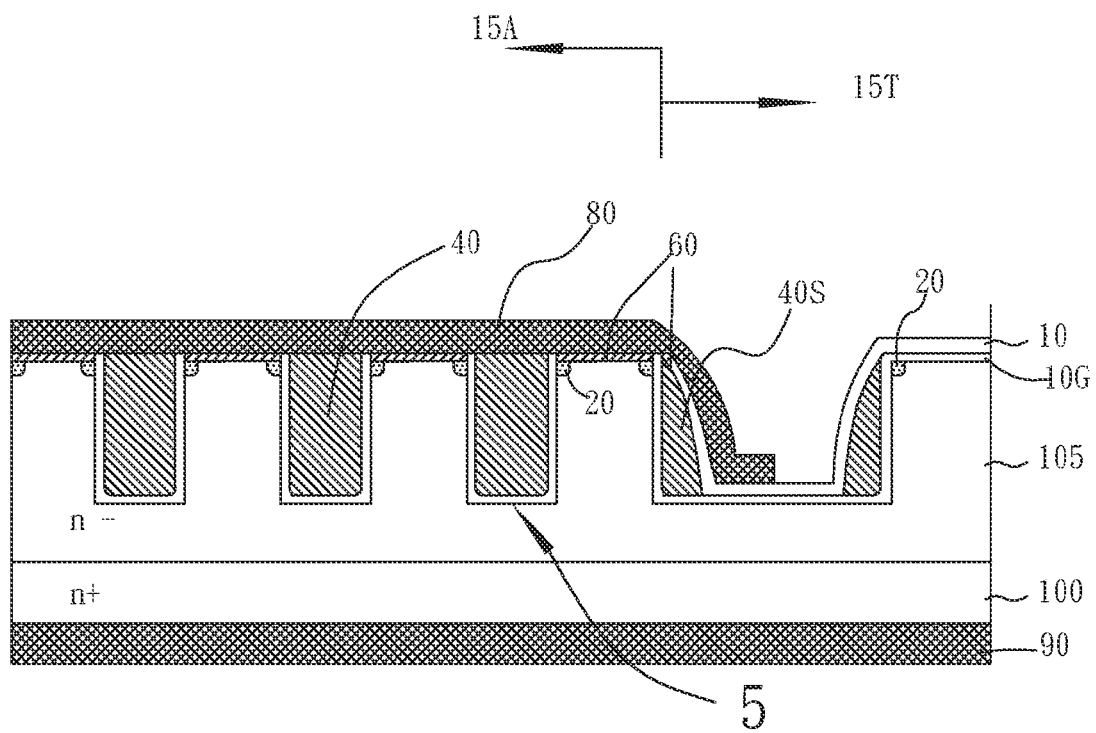
FIG. 1 illustrates a cross sectional view of a trench rectifier in prior art.
Figure 2A:
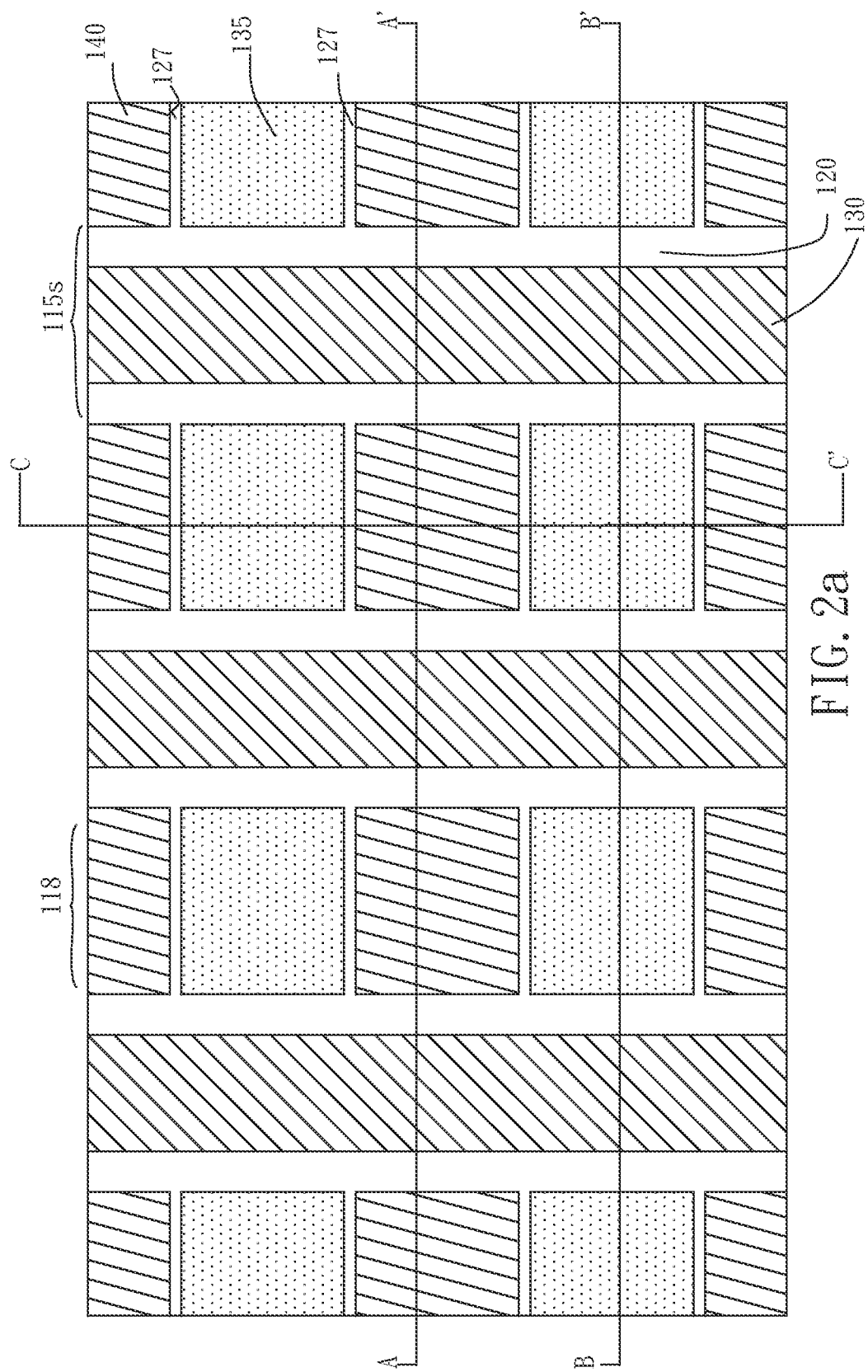
FIG. 2a illustrates a top view of the dual trench MOS structures (the top metal layer is not shown) in the first embodiment according to the present invention.

The present invention discloses a dual trench MOS rectifier. Please refer to the top view shown in FIG. 2a and the cross-sectional views shown in FIG. 11A to FIG. 11C. The symbol "#" of FIG. #A, FIG. #B and FIG. #C means the number of figures, and the capital letters A, B and C after the symbol "#" correspond with the lines A-A', B-B' and C-C' shown in top views of Figs. For best understanding of the detailed structures, the top metal layer 180 is not shown in the top views. The relations between the top metal layer 180 and other elements and the detailed structures of devices are shown in the cross sectional views.

In the first embodiment of the present invention, the dual trench MOS rectifier comprised of the following elements. A plurality of trenches 115 formed parallel in an n– epitaxial layer 105 on a heavy doped n+ semiconductor substrate 100. Each the trench 115 has a trench oxide layer 120 formed on a bottom and sidewalls thereof A plurality of recesses 125 are formed spaced by a distance in the n– epitaxial layer 105 below mesas 118. Each the recess 125 has a recess oxide layer 127 formed on a bottom and sidewalls thereof A first polysilicon layer 130 with a conductive impurity formed in the plurality of trenches 115, and a second polysilicon layer 140 with a conductive impurity formed and filled full in the plurality of recesses 125 to form MOS structures. The MOS structures include the second polysilicon layer 140, the recess oxide layer 127 and the n– epitaxial layer 105. A plurality of p type bodies (ion implanted areas) 135 are formed in the n– epitaxial layer 105 below the mesas 118 at two sides of the MOS structures. A top metal layer 180 is formed on top of the first and second polysilicon layers and P type bodies for serving as an anode, and a bottom metal layer 190 is formed beneath the heavy doped n+ semiconductor substrate for serving as a cathode.

Figure 2B:
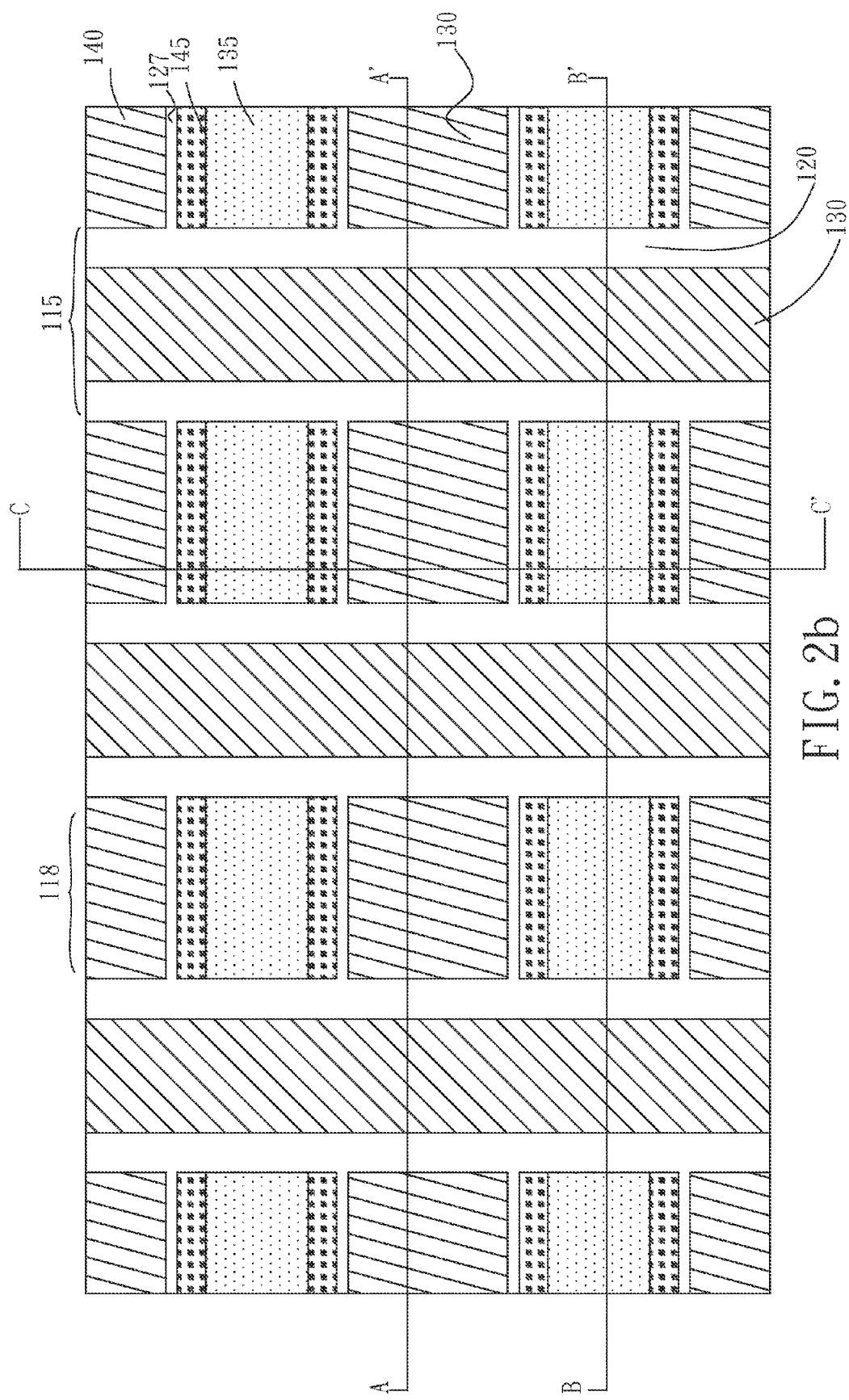
FIG. 2b illustrates a top view of the varied design of the dual trench MOS structures (the top metal layer is not shown) in the first embodiment according to the present invention.

A varied design of the first embodiment is that each the p type body 135 includes two n+ ion implanted areas 145 which are applied to lower the initial bias $V_F$. Please refer to the top view shown in FIG. 2b and the cross sectional views shown in FIG. 13A to FIG. 13C.

Figure 3A:
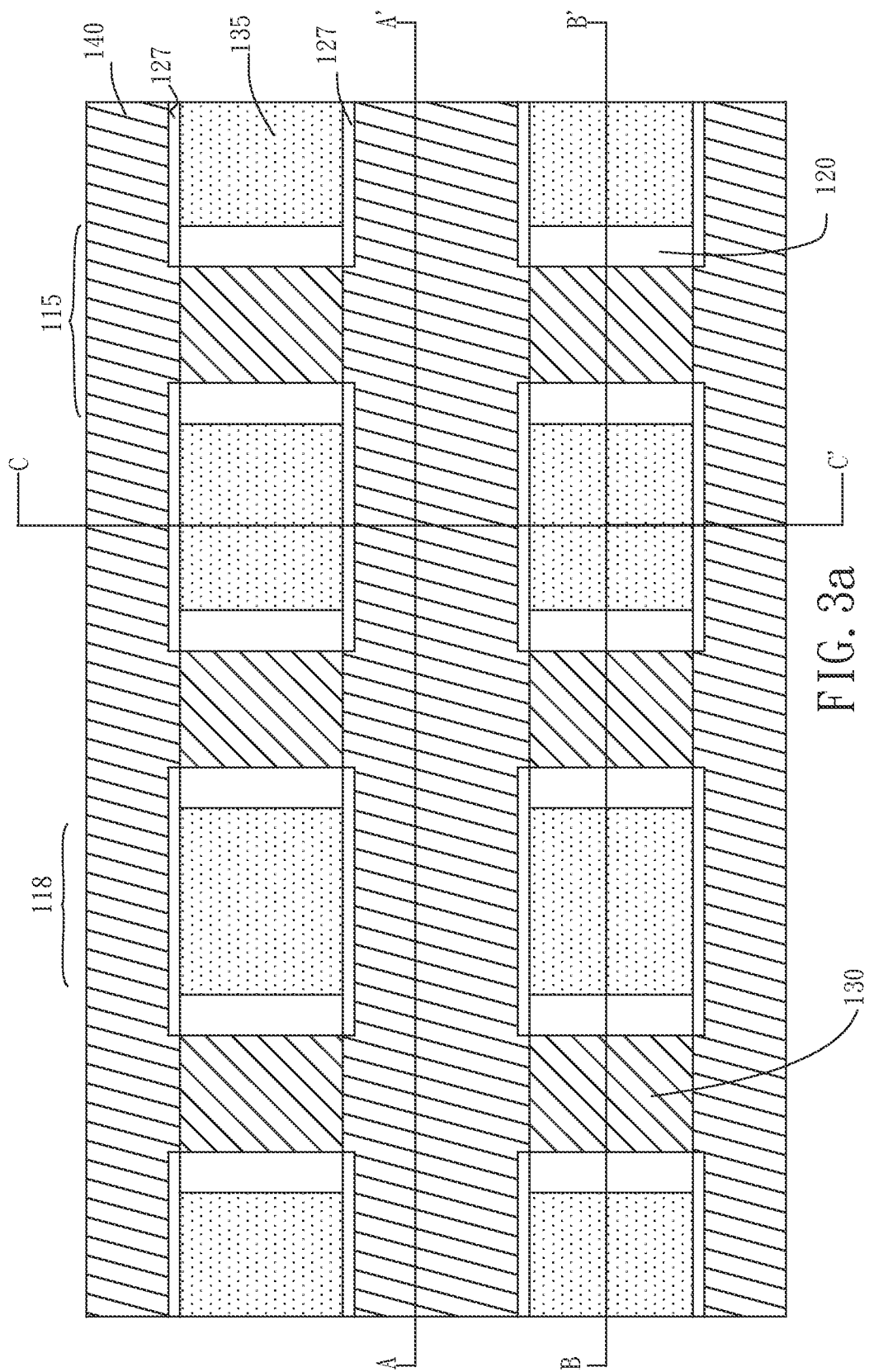
FIG. 3a illustrates a top view of the dual trench MOS structures (the top metal layer is not shown) in the second embodiment according to the present invention.
Figure 16A:
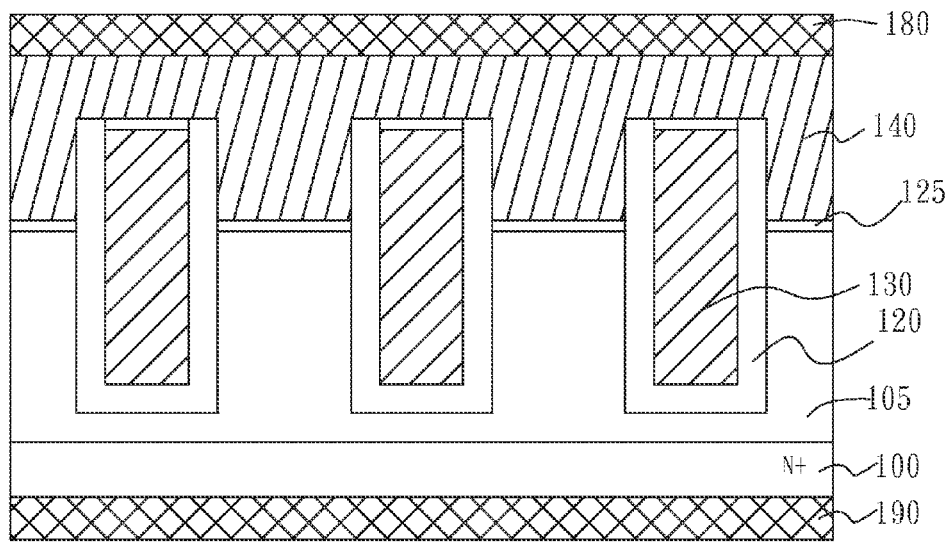
FIG. 16A, FIG. 16B and FIG. 16C are the cross sectional views respectively along the A-A' line, the B-B' line and the C-C' line shown in FIG. 3a to illustrate the final structure of the dual trench rectifier according to the second embodiment.
Figure 16B:
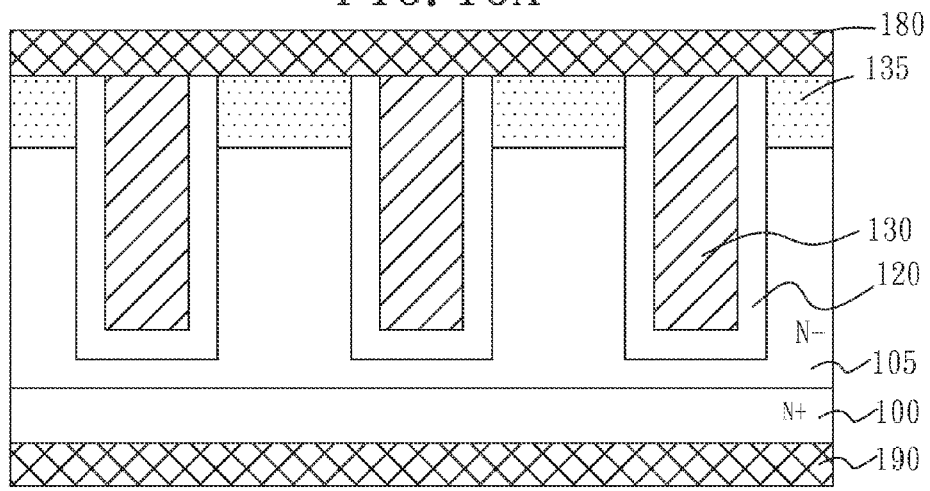
Figure 16C:
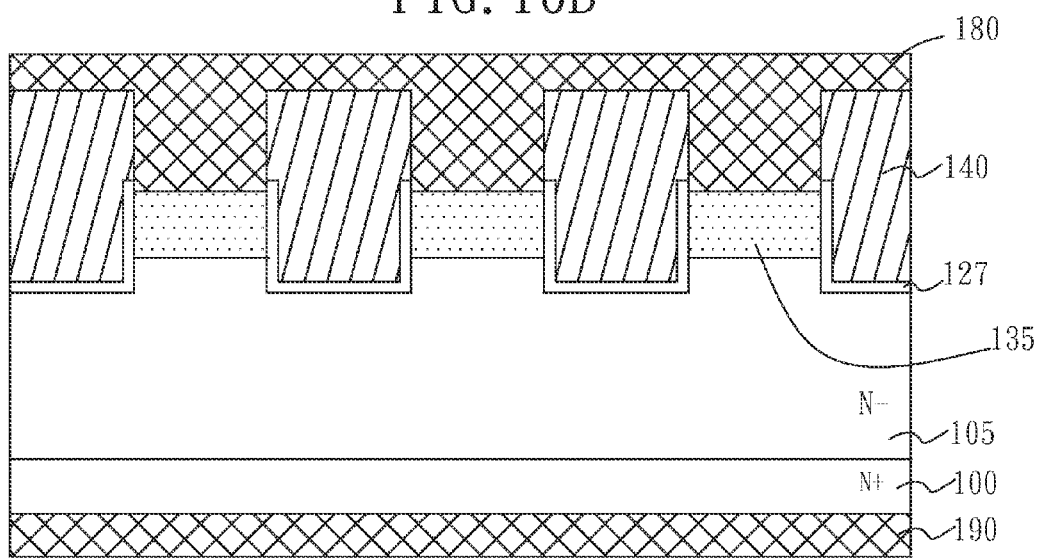

In the second embodiment, referring to the top view shown in FIG. 3a and the cross sectional views shown in FIG. 16A to FIG. 16C. The second polysilicon layer 140 doped with a conductive impurity is formed in and overfilled the recesses 125 to cover the mesas, thereby to be higher than the recess oxide layer 127 on the first polysilicon layer 130 of the trenches 115. The second polysilicon layer 140 is then patterned to form rows of MOS structures perpendicular to the trenches 115. The rows of the MOS structures include the second polysilicon layer 140, the recess oxide layer 127 and the n– epitaxial layer 105. A plurality of p type bodies 135 are formed in the n– epitaxial layer 105 below the mesas 118 adjacent to the MOS structures. A top metal layer 180 is formed on the MOS structures and the p type bodies 135 for serving as an anode, and a bottom metal layer 190 is formed beneath the heavy doped n+ semiconductor substrate 100 for serving as a cathode.

Figure 3B:
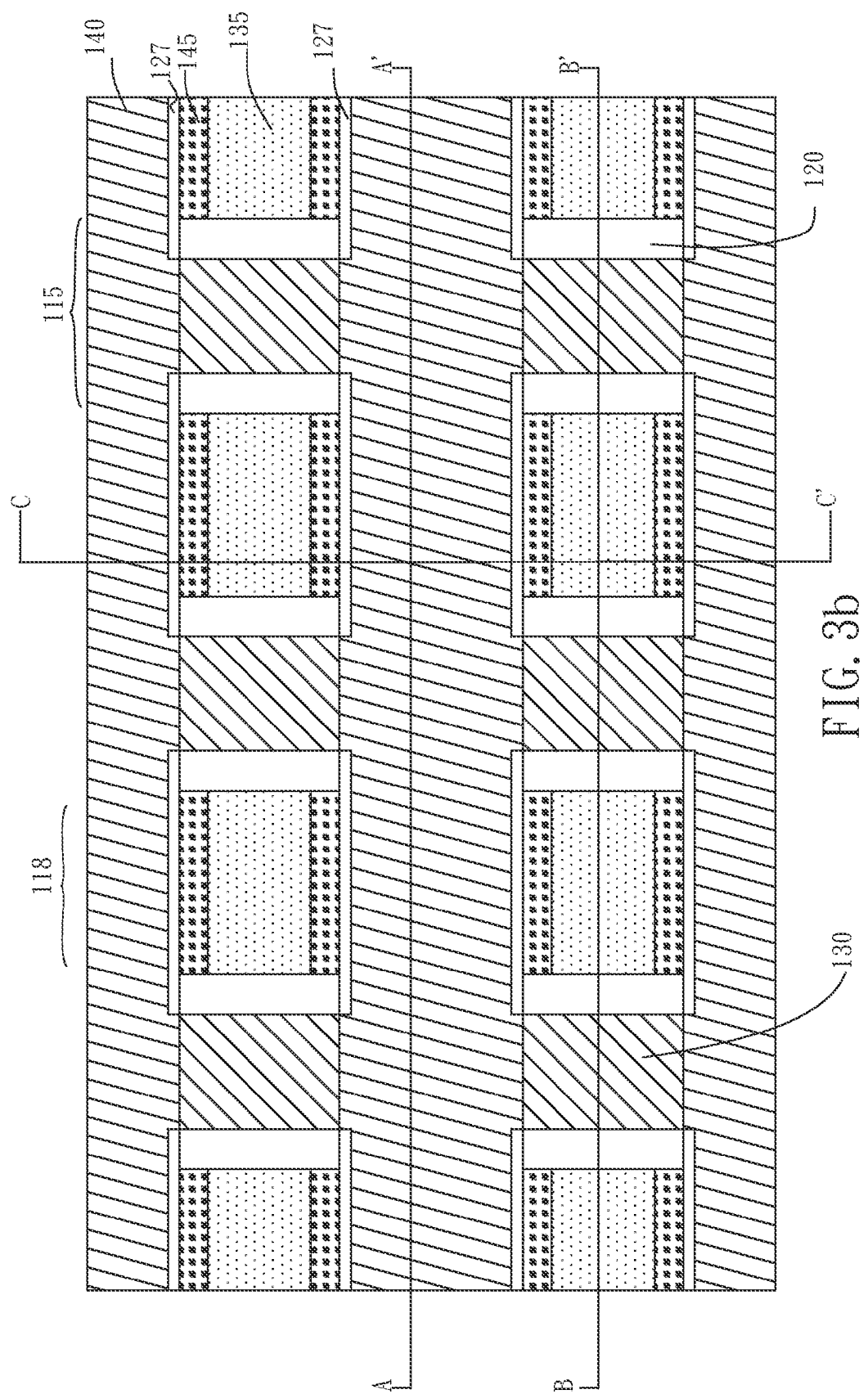
FIG. 3b illustrates a top view of the varied design of the dual trench MOS structures (the top metal layer is not shown) in the first embodiment according to the present invention.
Figure 18A:
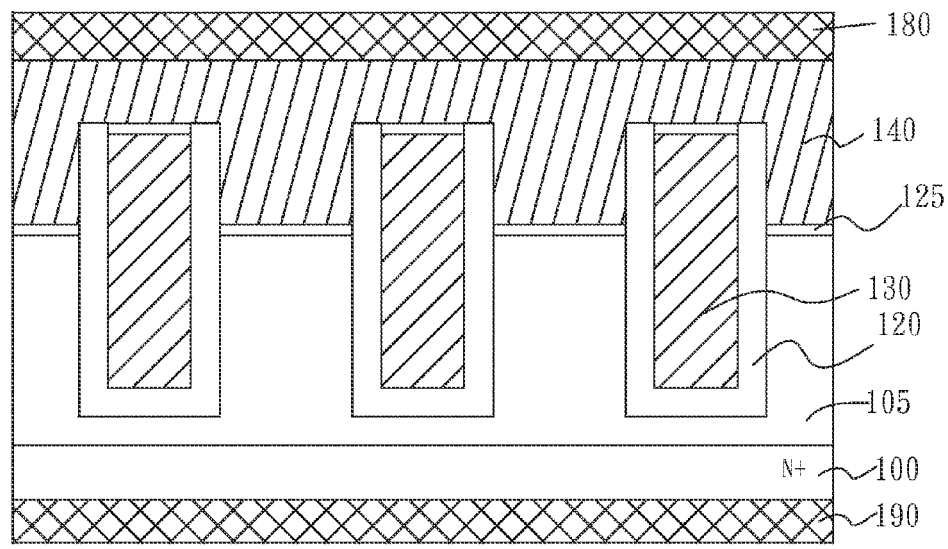
FIG. 18A, FIG. 18B and FIG. 18C are the cross sectional views respectively along the A-A' line, the B-B' line and the C-C' line shown in FIG. 3b to illustrate the final structure of the dual trench rectifier according to the varied design of the second embodiment.
Figure 18B:
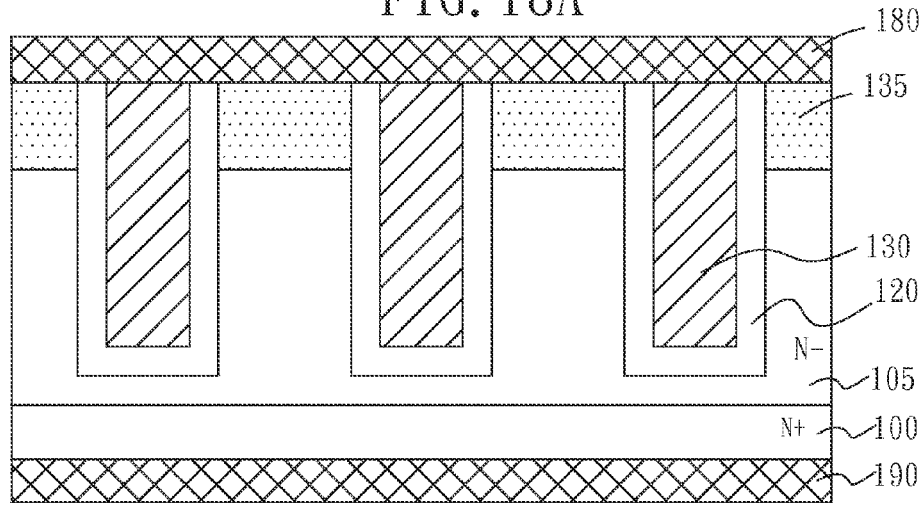
Figure 18C:
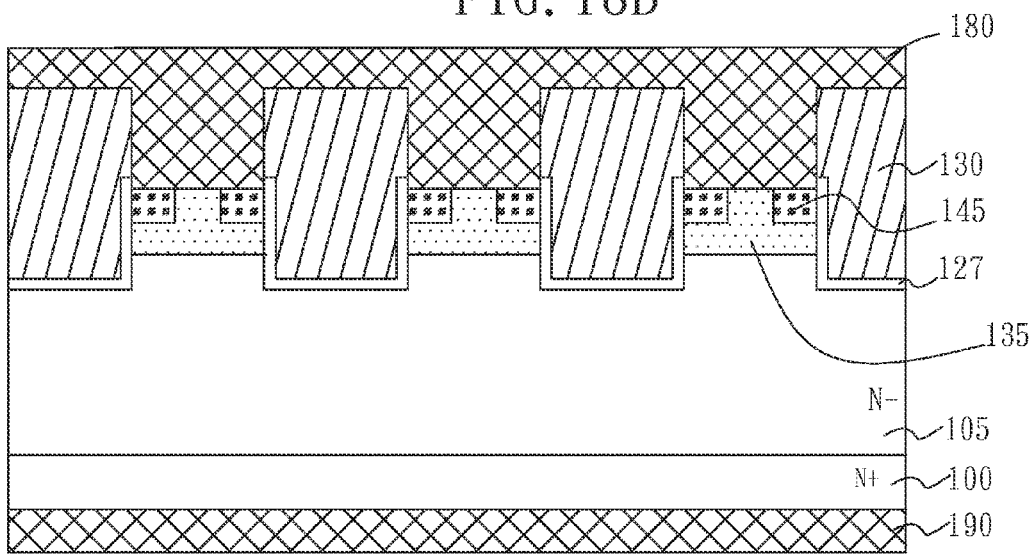

A varied design of the second embodiment is that the p type bodies 135 further include two n+ ion implanted areas 145, as illustrated in the top view shown in FIG. 3b and the cross sectional views shown in FIG. 18A to FIG. 18C.

The detailed process is illustrated as follows. It is noted that the minus sign "–" following n or p means lightly doped and the plus sign "+" means heavy doped.

Figure 4:
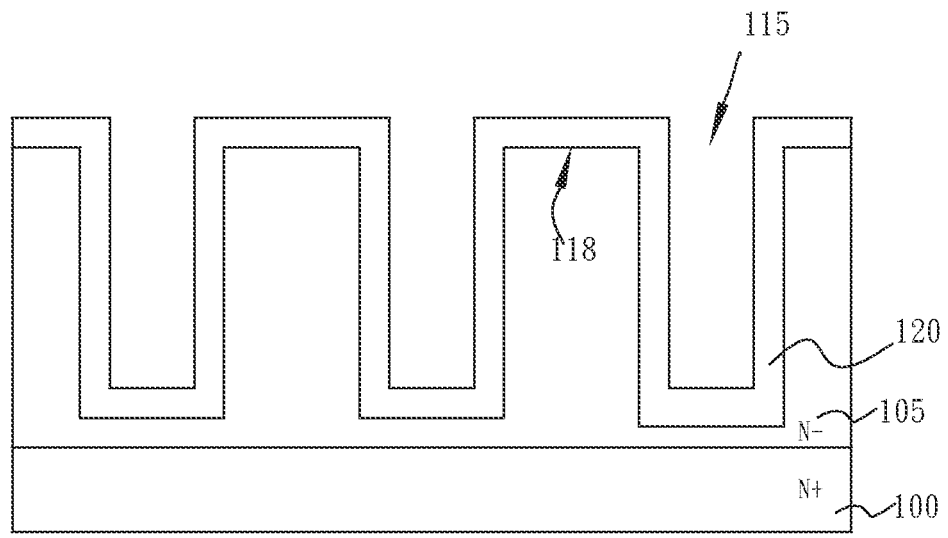
FIG. 4 illustrates a cross sectional view of the trenches formed in the n– epitaxial layer having the trench oxide layer.

Please refer to the cross sectional view shown in FIG. 4, which illustrate that the n+ semiconductor substrate 100 with heavy doped n type impurity includes an n– epitaxial layer 105 with lightly doped n type impurity. A dry etching process is performed to form the plurality trenches 115 by using the photoresist pattern as an etching mask (not shown) or using a hard mask (not shown) as well known in prior art.

Then, a thermal oxidation process is performed to form the trench oxide layer 120 on the bottom and sidewalls of the trenches 115. This step can also fix the damage occurred in the etching step before.

Figure 5:
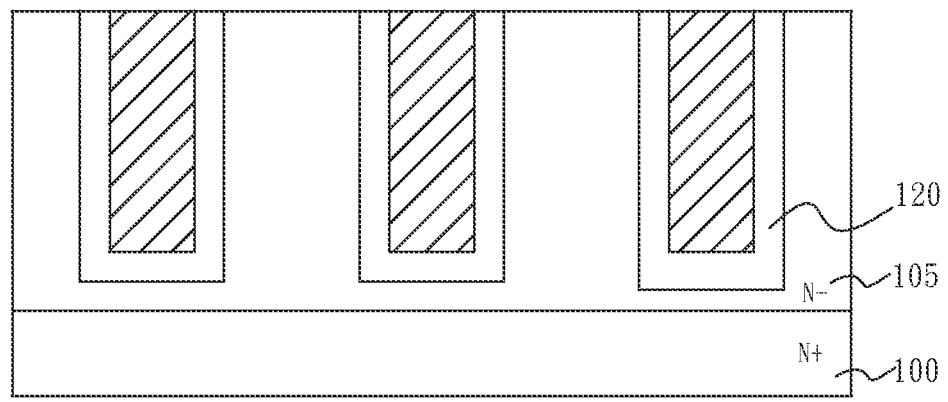
FIG. 5 is a cross sectional view of the trenches and the trench oxide layer illustrating that the first polysilicon layer is filled therein and etched back to remove the portion of the first polysilicon layer over the mesas.

Please refer to FIG. 5, the first polysilicon layer 130 with a conductive impurity is deposited and doped to fill fully and cover the trenches 115. Then, an etching back procedure or a chemical mechanical polishing (CMP) process is applied to remove the first polysilicon layer 130 over the mesas 118 until the upper surface of the n– epitaxial layer 105 of the mesas 118 is exposed.

Figure 6A:
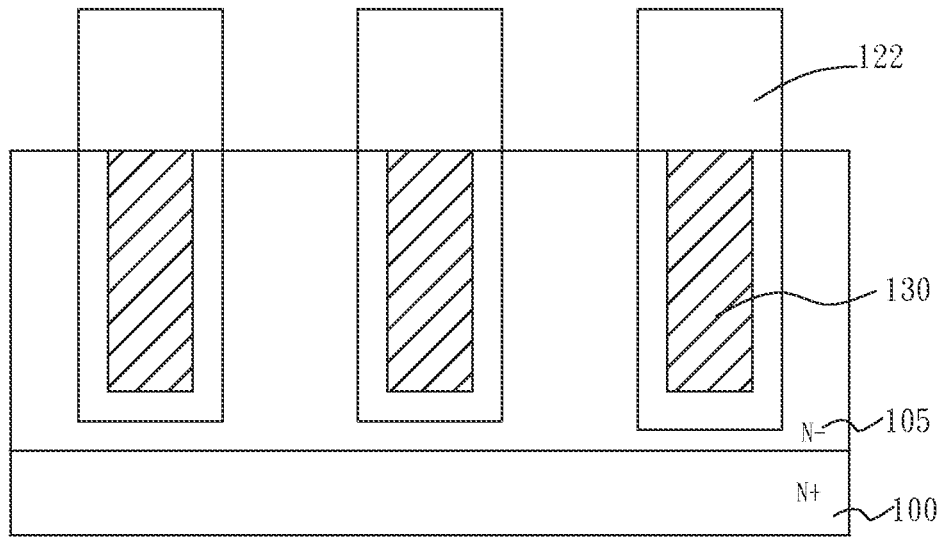
FIG. 6A and FIG. 6B are the cross sectional views respectively along the A-A' line and the B-B' line shown in FIG. 2a to illustrate the photoresist pattern for defining the locations of the recesses.
Figure 6B:
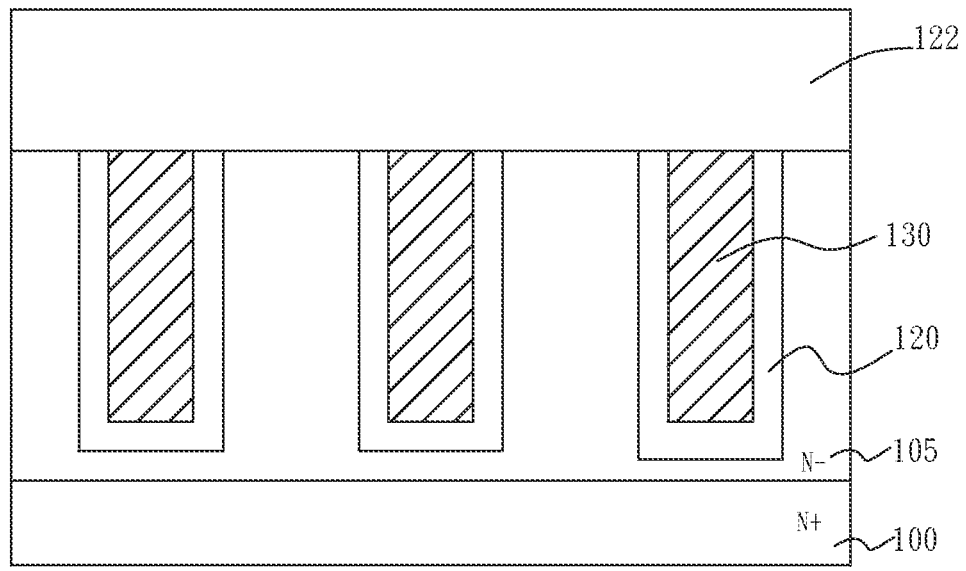

Then, referring to FIG. 6A and FIG. 6B, which illustrate respectively the cross sectional views perpendicular to the directions of the trenches 115 at two different locations. After etching back, the photoresist pattern 122 is formed to define the locations of recesses. The recesses are formed on the mesas 118 between the trenches 115 along the A-A' line shown in FIG. 2a, and the photoresist pattern 122 is applied to provide protection along the B-B' line shown in FIG. 2b.

Figure 7A:
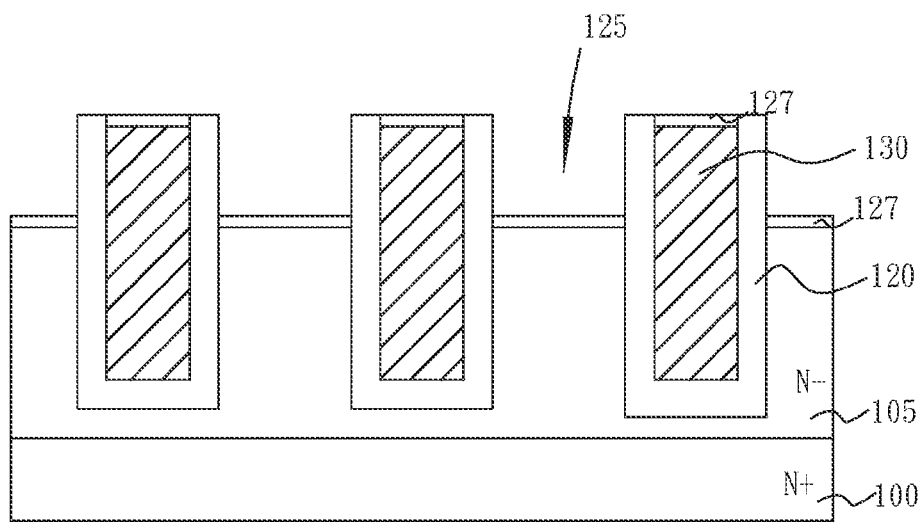
FIG. 7A, FIG. 7B and FIG. 7C are the cross sectional views respectively along the A-A' line, the B-B' line and the C-C' line shown in FIG. 2a to illustrate the recesses and the recess oxide layer.
Figure 7B:
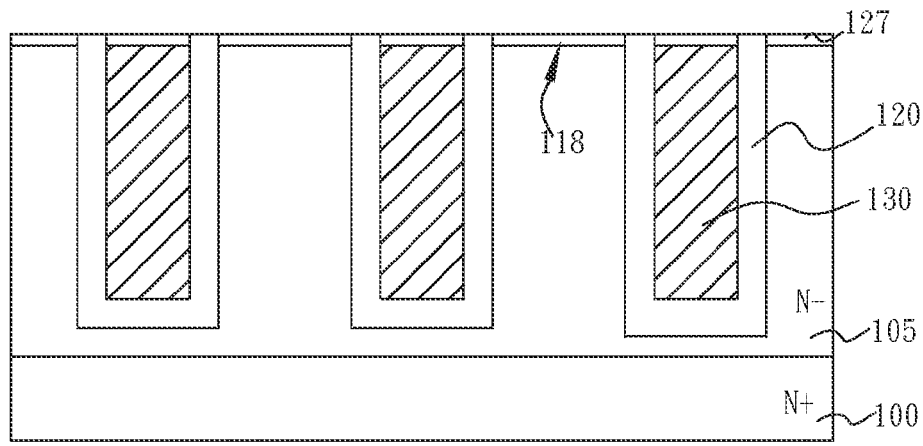
Figure 7C:
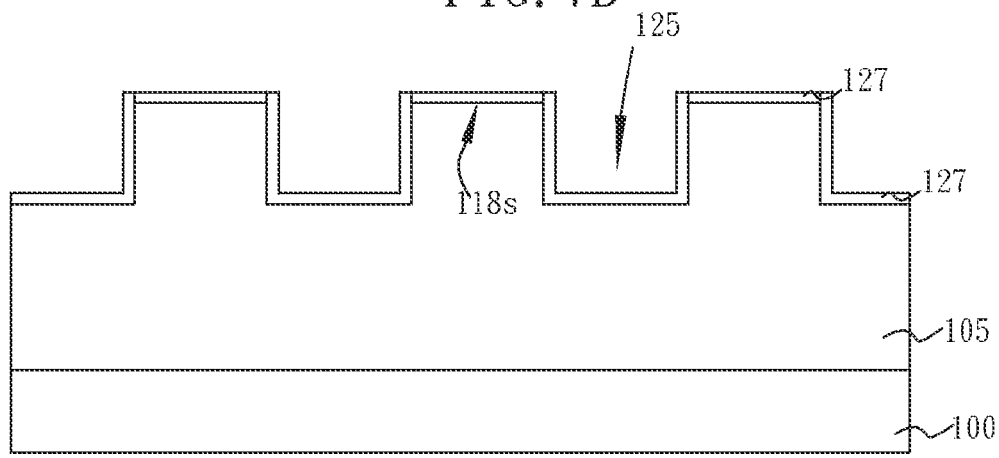

A plasma etching process is performed to form the recesses 125 in the mesas 118 by using the photoresist pattern 122 as an etching mask. Referring to FIG. 7A and FIG. 7B, which illustrate respectively the cross sectional views perpendicular to the directions of the trenches 115. FIG. 7C illustrates the cross sectional view along the directions of the trenches 115. After the photoresist is removed, a thermal oxidation process is performed to form the recess oxide layer 127 on the bottom and sidewalls of the recesses 125 and on the upper surface of the mesas adjacent to the recesses 125 and on the first polysilicon layer 130. It is noted that the recess oxide layer is thinner than the trench oxide layer 120.

Figure 8A:
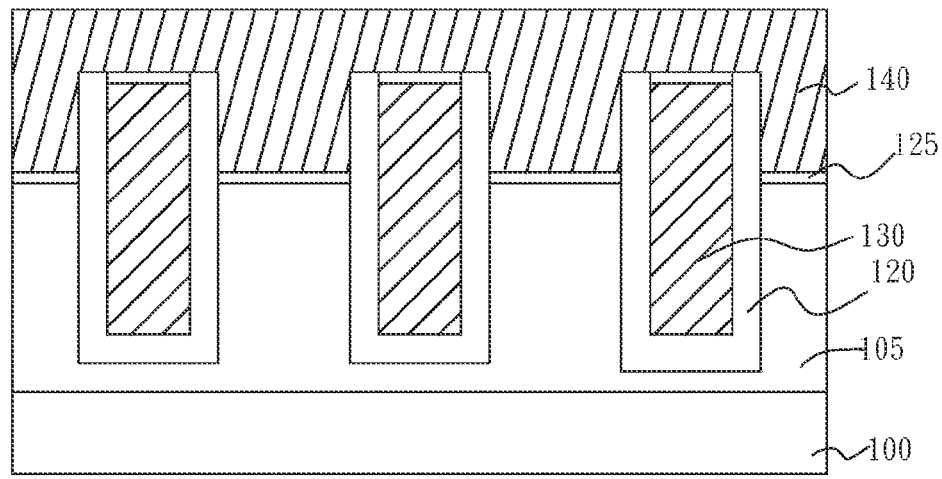
FIG. 8A, FIG. 8B and FIG. 8C are the cross sectional views respectively along the A-A' line, the B-B' line and the C-C' line shown in FIG. 2a to illustrate the second polysilicon layer being formed.
Figure 8B:
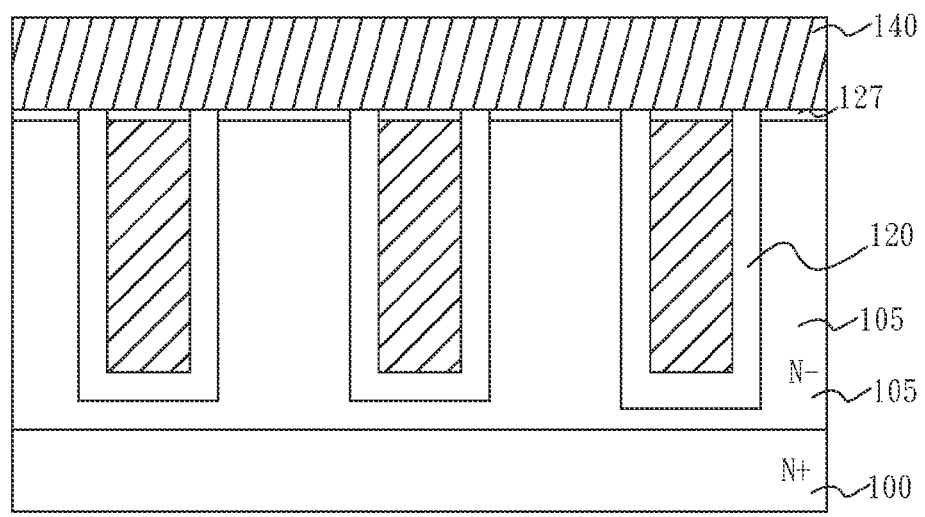
Figure 8C:
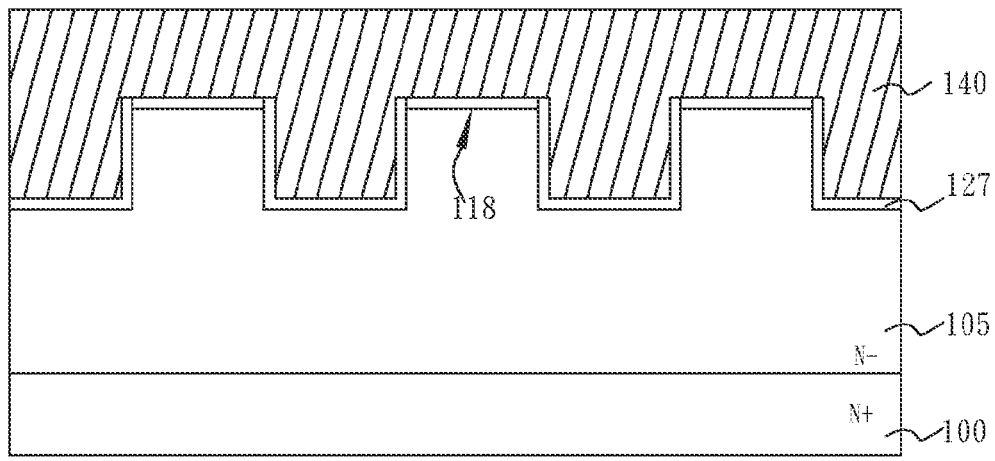

The second polysilicon layer 140 is deposited and doped with a conductive impurity to overfill all the recesses 125. FIG. 8A to FIG. 8C show the cross sectional views along three lines A-A', B-B' and C-C' shown in FIG. 2a.

Figure 9A:
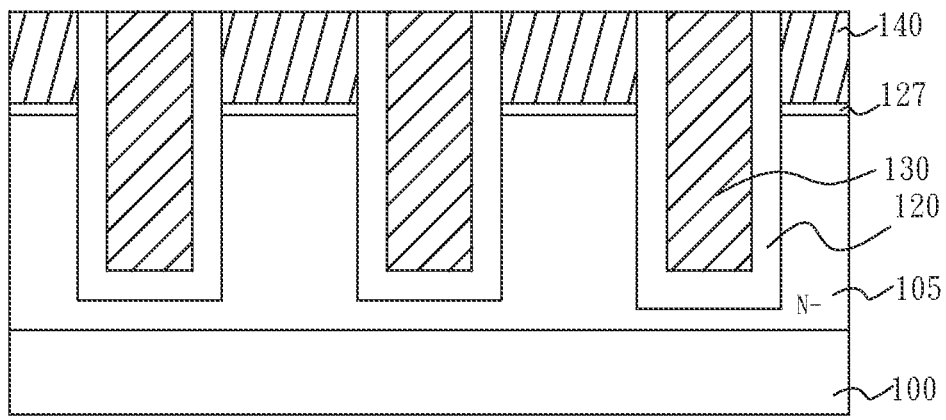
FIG. 9A, FIG. 9B and FIG. 9C are the cross sectional views respectively along the A-A' line, the B-B' line and the C-C' line shown in FIG. 2a to illustrate the second polysilicon layer being etched back.
Figure 9B:
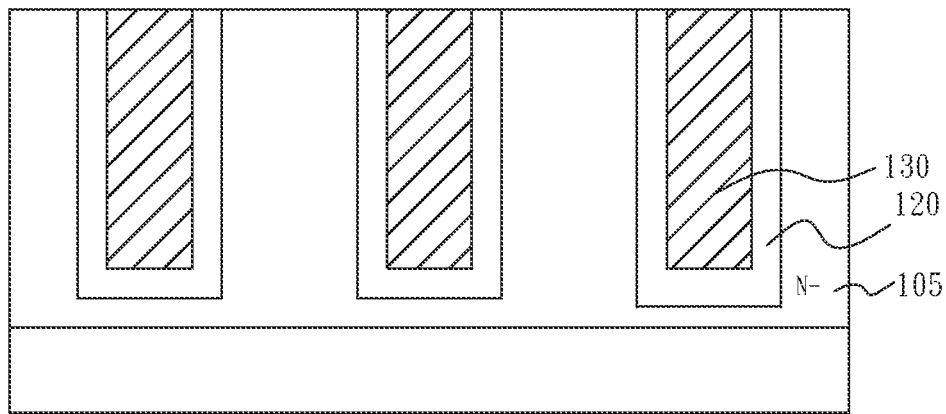
Figure 9C:
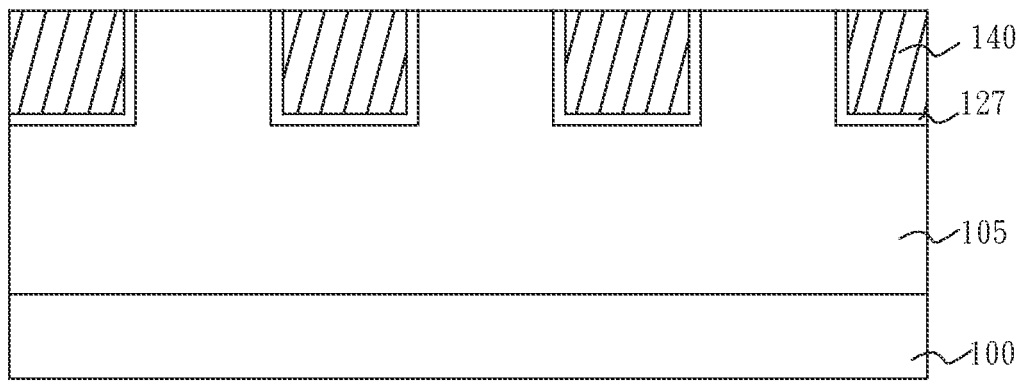

Then, as shown in FIG. 9A to FIG. 9C, an etching back process or a chemical mechanical polishing (CMP) process is applied to remove the second polysilicon layer 140 over the mesas 118 until the recess oxide layer 127 on the mesas 118 is removed and the upper surface of the n– epitaxial layer 105 of the mesas 118 is exposed, for forming the MOS structures in the recesses 125.

Figure 10A:
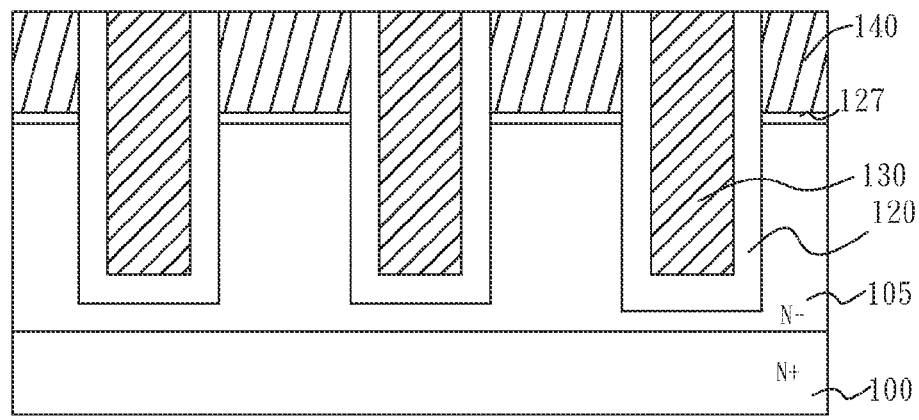
FIG. 10A, FIG. 10B and FIG. 10C are the cross sectional views respectively along the A-A' line, the B-B' line and the C-C' line shown in FIG. 2a to illustrate the p type bodies formed in the n– epitaxial layer below mesa.
Figure 10B:
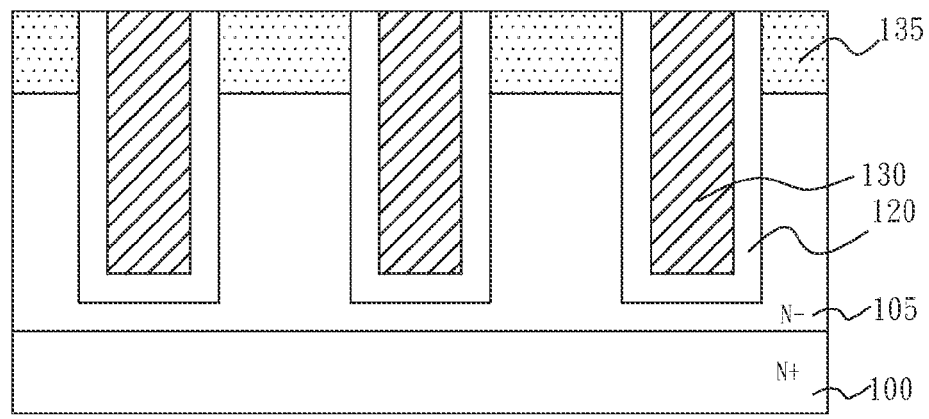
Figure 10C:
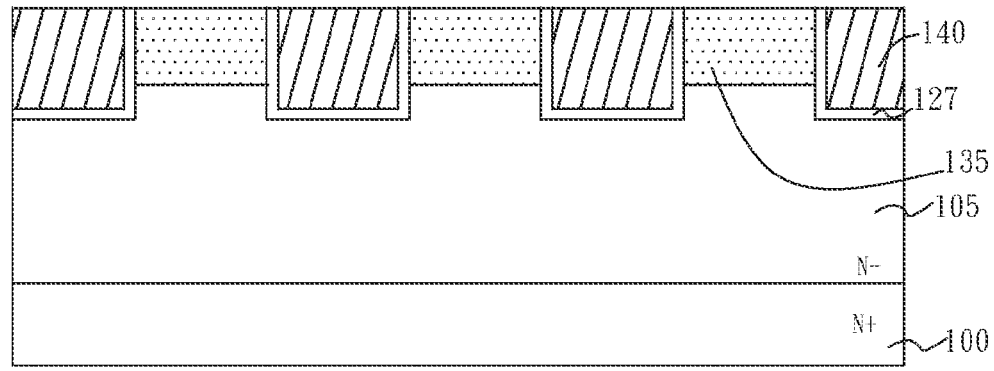

Please refer to FIG. 10A to FIG. 10C. An ion implanting procedure is performed to implant totally the p type conductive ions, to form p type bodies 135 below the mesas 118 adjacent to the MOS structures. The dosage of implanted ions causes the concentration of n type ions in the p type bodies 135 higher than that in the n– epitaxial layer 105 about 1 to 3 orders in magnitudes, such as $1E12$-$1E14/cm^2$. The energy of implanting is about 10 keV-1000 keV. Then, a buffer solution or a diluted HF solution is applied to remove the oxide layer on the planar surface.

Figure 11A:
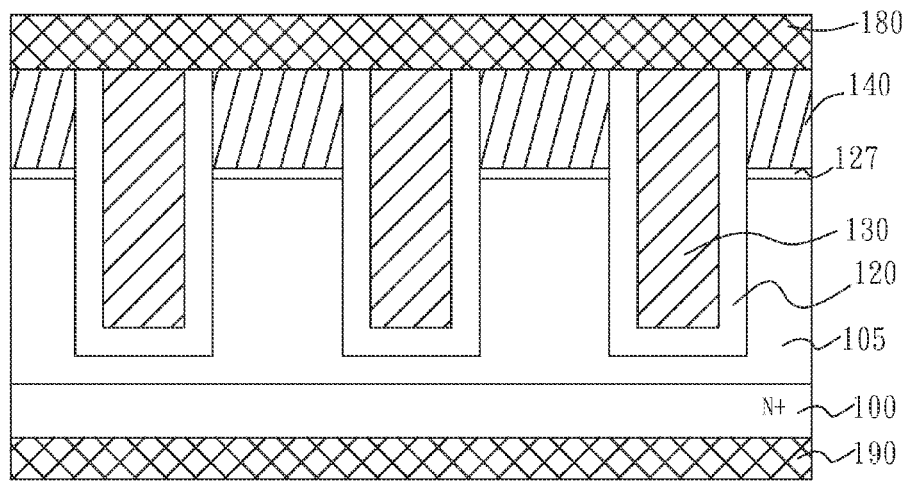
FIG. 11A, FIG. 11B and FIG. 11C are the cross sectional views respectively along the A-A' line, the B-B' line and the C-C' line shown in FIG. 2a to illustrate the final structure of the dual trench rectifier.
Figure 11B:
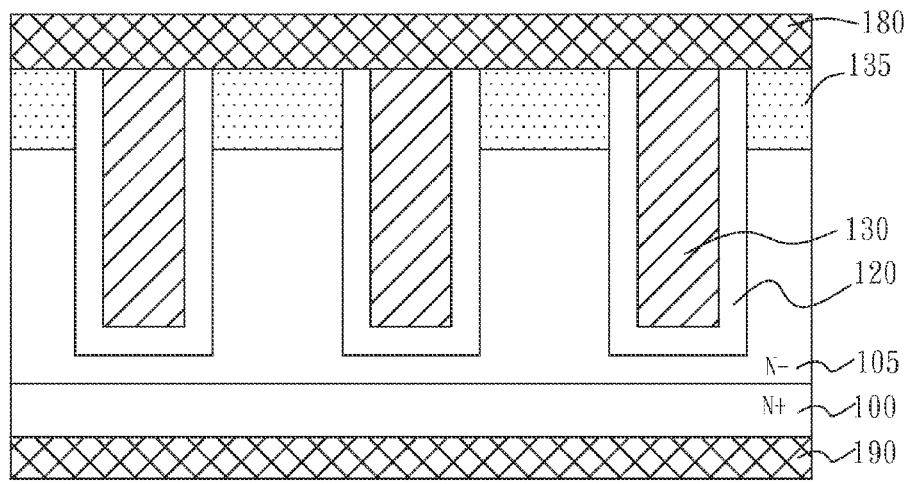
Figure 11C:
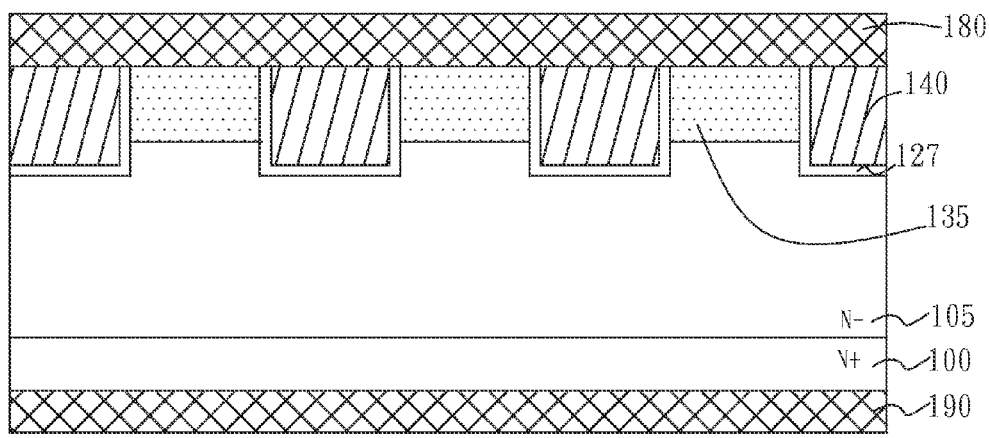

Please refer to cross sectional views shown in FIG. 11A to FIG. 11C. The top metal layer 180 is formed. A self-aligned metal silicide process is performed before forming the top metal layer 180. For example, a sputtering process is performed to deposit Ti/TiN, and then an RTA or a wet etching is applied to remove the unreacted metal layer. The top metal layer 180 generally includes one to three compositional layers, such as TiNi/Ag, TiW/Al or Al, etc.

Figure 12A:
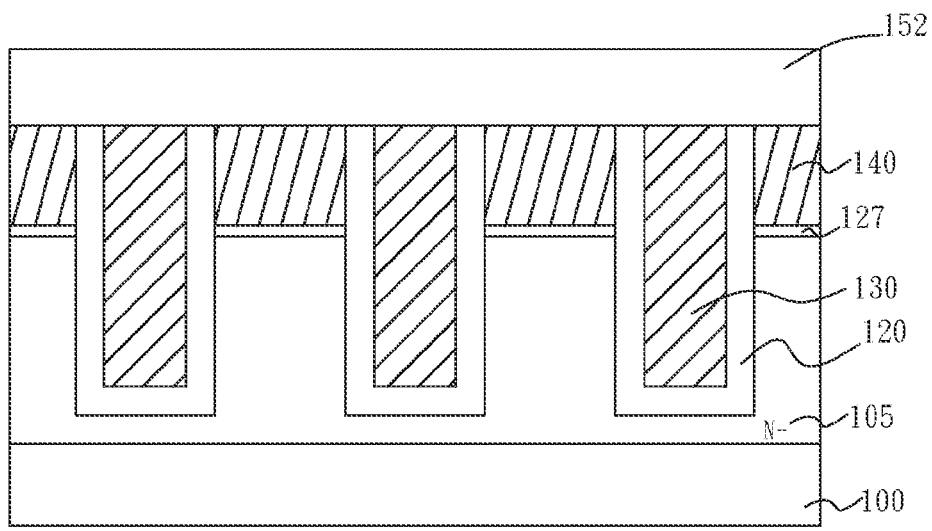
FIG. 12A, FIG. 12B and FIG. 12C are the cross sectional views respectively along the A-A' line, the B-B' line and the C-C' line shown in FIG. 2b to illustrate the photoresist pattern for defining the varied design of the first embodiment.
Figure 12B:
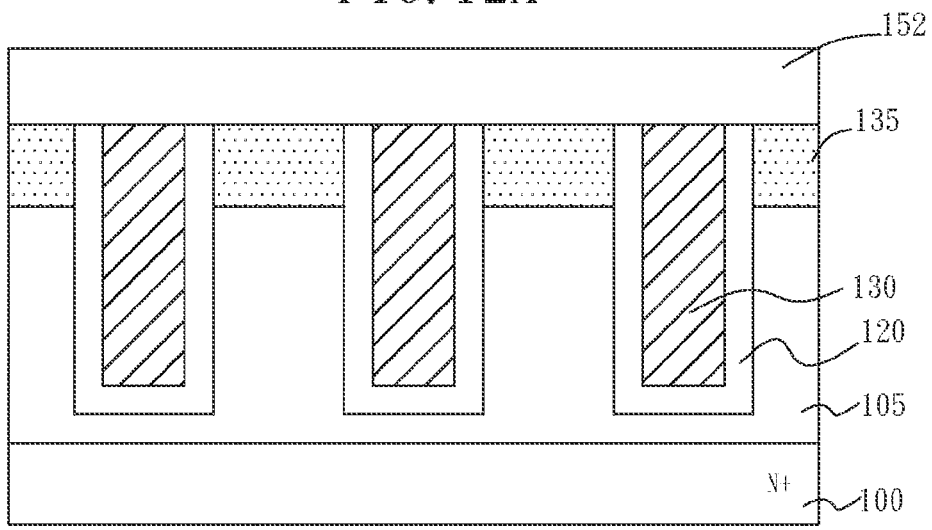
Figure 12C:
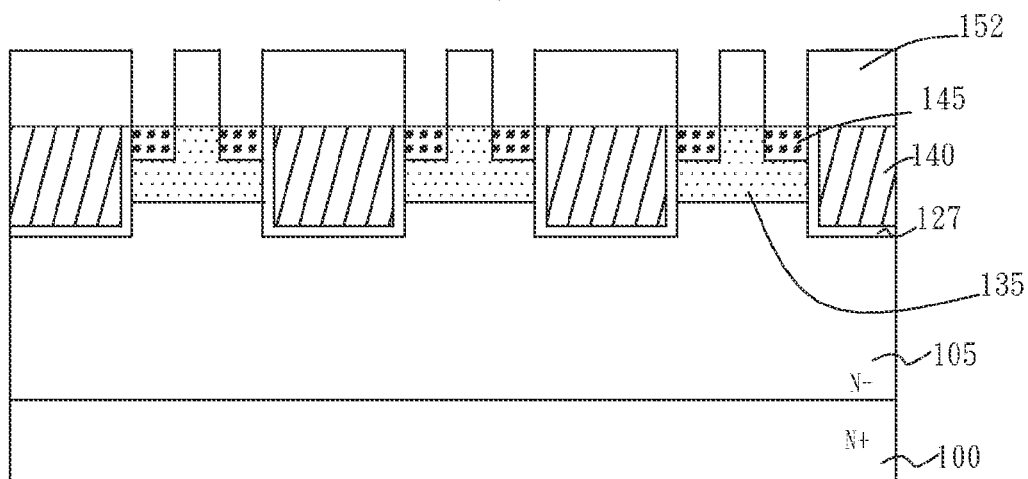
Figure 13A:
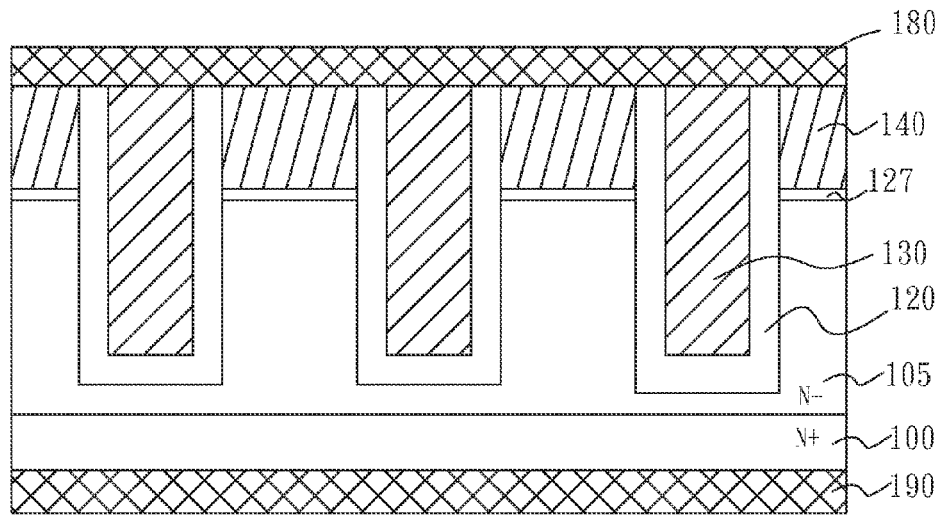
FIG. 13A, FIG. 13B and FIG. 13C are the cross sectional views respectively along the A-A' line, the B-B' line and the C-C' line shown in FIG. 2b to illustrate the final structure of the dual trench rectifier according to the varied design of the second embodiment.
Figure 13B:
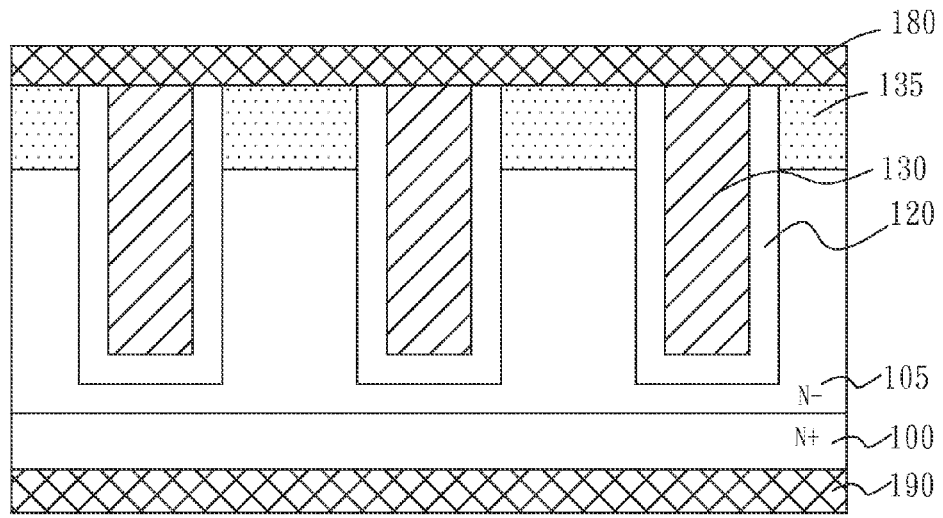
Figure 13C:
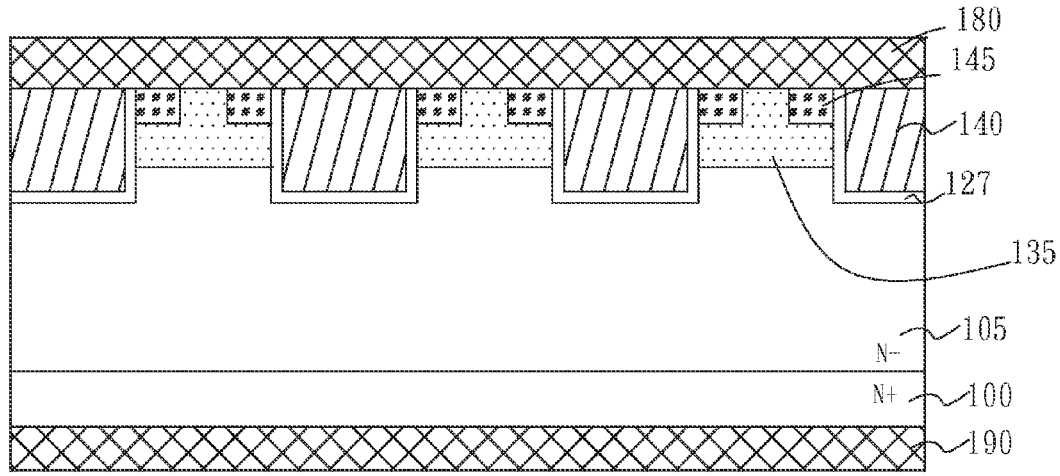

The varied design of the first embodiment is to form two n+ areas (n type heavy doped areas) in the p type body 135. FIG. 12A to FIG. 12C illustrate the photoresist pattern masks are applied for ion implanting. FIG. 13A to FIG. 13C illustrate the cross sectional views of the final structures of the p type body 135 including two n+ ion implanted areas 145.

In the second embodiment of the present invention, the steps before etching back the second polysilicon layer 140 are same as those in the first embodiment, as shown in FIG. 4 to FIG. 8. After, the following steps are performed.

Figure 14A:
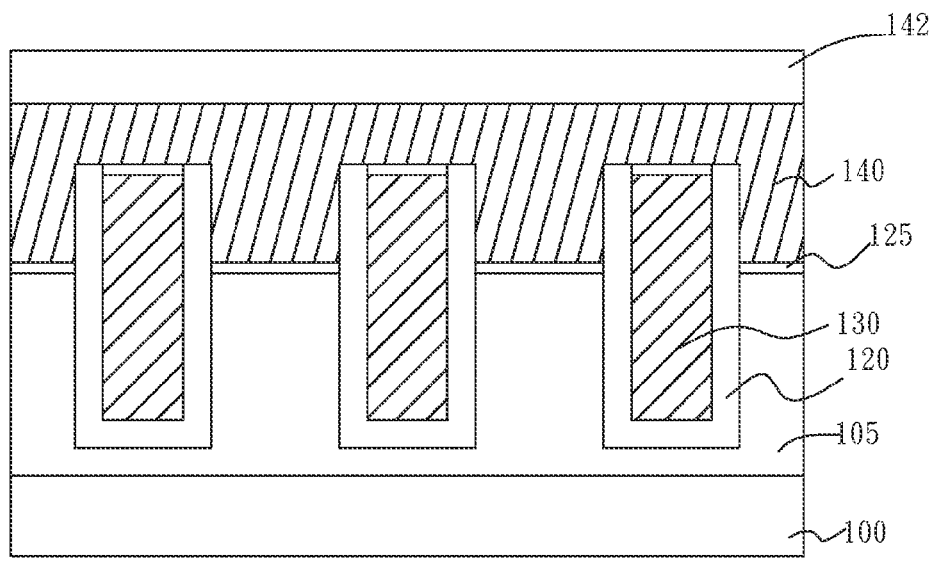
FIG. 14A, FIG. 14B and FIG. 14C are the cross sectional views respectively along the A-A' line, the B-B' line and the C-C' line shown in FIG. 3a to illustrate the second polysilicon layer after pattern defining in the second embodiment.
Figure 14B:
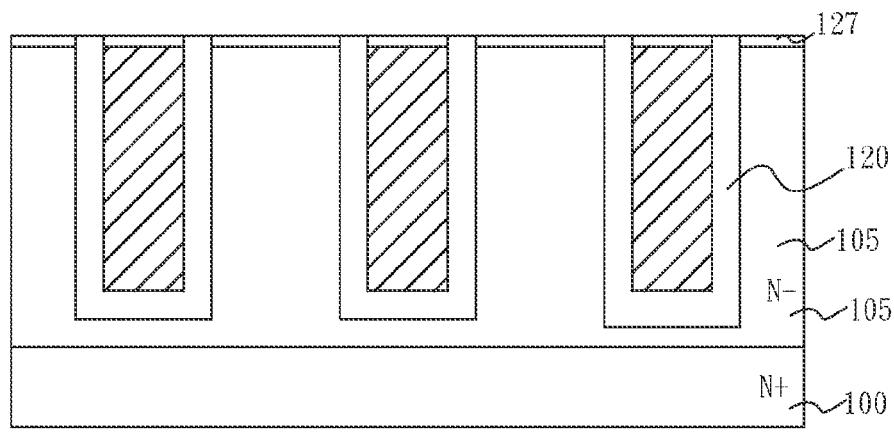
Figure 14C:
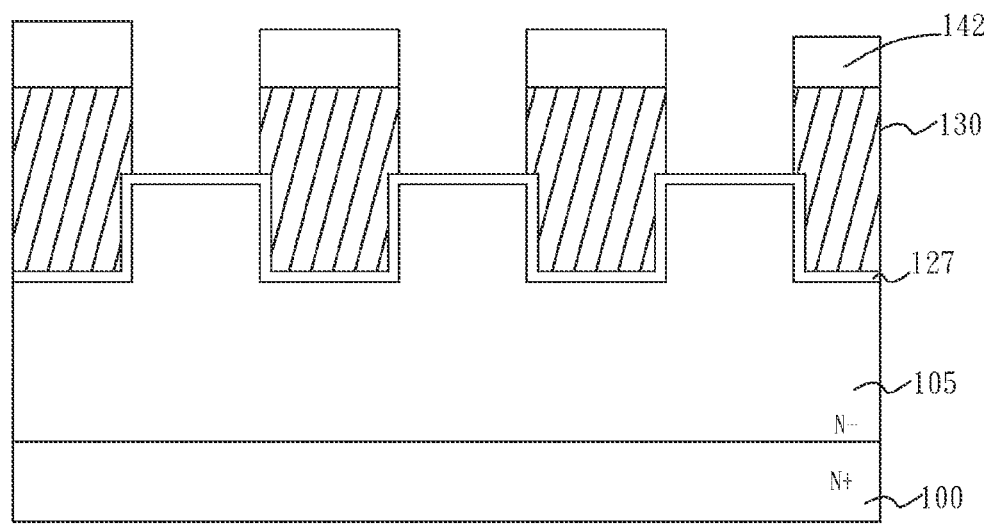
Figure 15A:
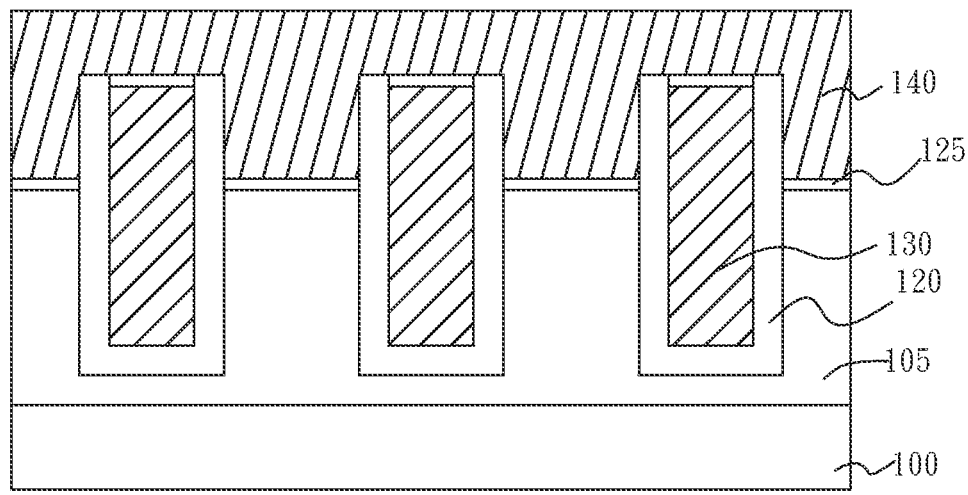
FIG. 15A, FIG. 15B and FIG. 15C are the cross sectional views respectively along the A-A' line, the B-B' line and the C-C' line shown in FIG. 3a to illustrate the p type bodies formed in the n– epitaxial layer below mesa according to the second embodiment.
Figure 15B:
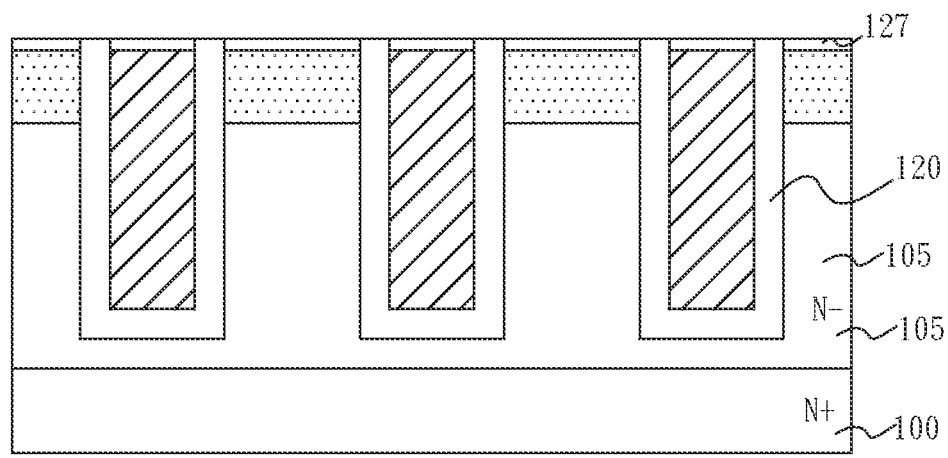
Figure 15C:
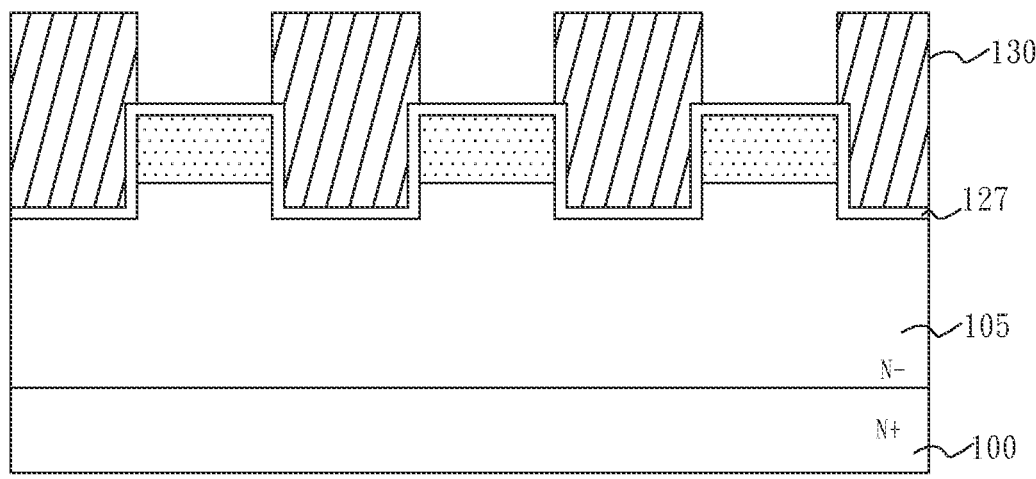

The photoresist pattern 142 is formed to define the second polysilicon layer 140. Then, the second polysilicon layer 140 is etched by plasma using the photoresist pattern 142 as an etching mask to define the MOS structures. The rows of MOS structures include the second polysilicon layer 140, the recess oxide layer 127 and the n– epitaxial layer 105. As shown in FIG. 3A and FIG. 14A to FIG. 14C, the second polysilicon layer 140 along the B-B' line is removed, and the second polysilicon layer 140 along the A-A' line is protected by the photoresist pattern 142. The photoresist pattern along C-C' line is as shown in FIG. 14C. The structure after etching is shown as in FIG. 14A to FIG. 14C.

The photoresist pattern 142 is removed, and then an ion implanting is performed to totally implant the p type conductive ions, to form p type bodies 135 below the mesas adjacent to the rows of MOS structures. The dosage of ion implanting is same as that in the first embodiment.

Please refer to FIG. 16A to FIG. 16C, the buffer solution or diluted HF solution is applied to remove the oxide layer on the planar surface completely. The top metal layer 180 is then formed. The method of forming the top metal layer 180 is same as that in the first embodiment.

Figure 17A:
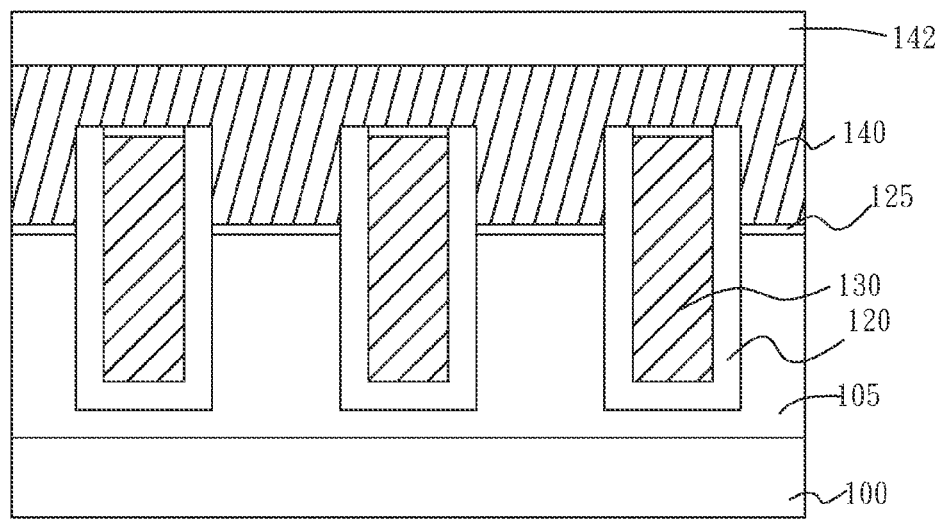
FIG. 17A, FIG. 17B and FIG. 17C are the cross sectional views respectively along the A-A' line, the B-B' line and the C-C' line shown in FIG. 3b to illustrate the photoresist pattern formed in the varied design of the second embodiment.
Figure 17B:
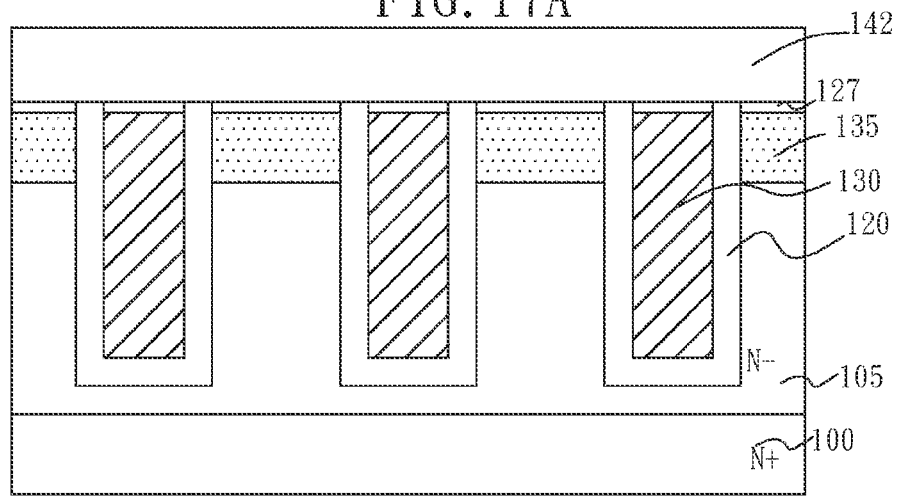
Figure 17C:
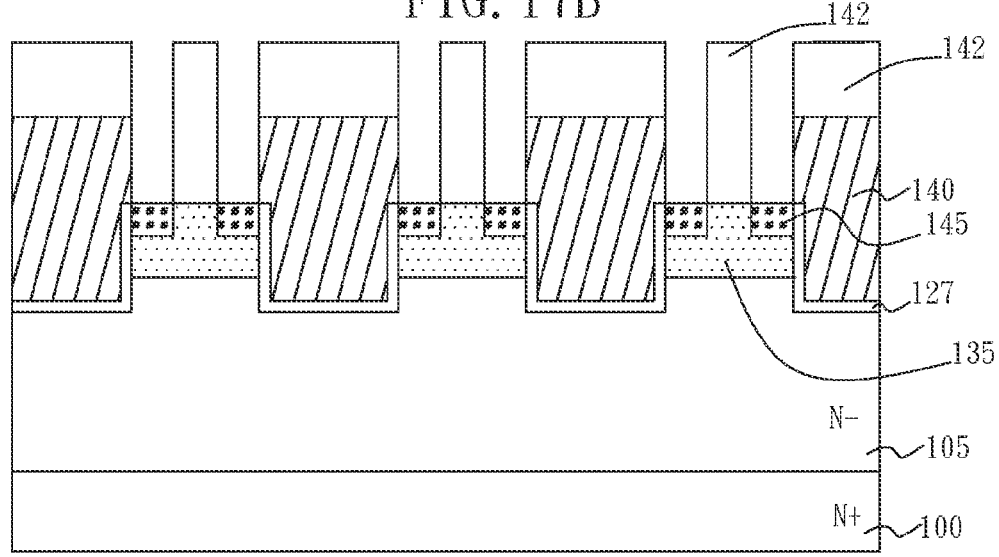

The second embodiment can also be varied as aforementioned to the first embodiment. The n+ conductive impurity is implanted in two sides of each p type body 135. FIG. 17A to FIG. 17C illustrate the photoresist pattern for ion implanting. FIG. 18A to FIG. 18C illustrate the cross sectional views after forming the top metal layer 180.

The present invention has following advantages. Comparing to the traditional trench rectifier, the dual trench rectifier provided by the present invention has the MOS structures formed in the trenches and the MOS structures formed in the recesses, thereby to eliminate the Schottky contact and lower reverse leakage current considerably. Besides, the oxide layer of the MOS structures formed in the recesses is thin enough to lower the initial bias $V_F$. Further, the n+ heavy ion implanted areas 145 are formed at two sides of p type bodies 135 adjacent to the rows of the MOS structures can reduce the initial bias in advance. On the other hand, the reverse leakage current can be effectively lowered, and the carrying current can be increased on the same size of the planar area because the structures formed in the trenches and the recesses.

The preferred embodiments of the invention have been set forth as above description, however the spirit and scope of the present invention are not limited to the aforementioned embodiments. It is easy for those who with ordinary skill in the art to understand and have modifications of the disclosed embodiments for the same purpose.

Therefore, the appended claims are intended to cover all embodiments which do not depart from the spirit and scope of the invention.

What is claimed is:
1. A dual trench rectifier comprising of:
   a plurality of trenches formed in parallel in an n– epitaxial layer on a heavy doped n+ semiconductor substrate, wherein the trenches each has a trench oxide layer formed on a bottom and sidewalls thereof;
   a plurality of recesses formed in the n– epitaxial layer at mesas between the plurality of trenches, wherein the recesses each has a recess oxide layer formed on a bottom and sidewalls thereof;
   a first polysilicon layer doped with conductive impurities formed and filled in the plurality of trenches;

a second polysilicon layer doped with conductive impurities formed and filled in the plurality of recesses;

a plurality of p type bodies formed in the n− epitaxial layer at the mesas, wherein said p type bodies each is interlaced with the recesses each along a longitudinal direction of the trenches;

a top metal layer formed on and contacted the first and second polysilicon layers and the mesas for serving as an anode, and a bottom metal layer formed beneath the heavy doped n+ semiconductor substrate for serving as a cathode.

2. The dual trench rectifier of claim 1, wherein each the p type body includes two n+ ion implanted areas individually adjacent to two sides of the MOS structures.

3. The dual trench rectifier of claim 1, further comprising a metal silicide layer formed in between the second polysilicon layer and the top metal layer and formed in between the n-epitaxial layer and the top metal layer.

4. A dual trench rectifier comprising of:

a plurality of trenches formed in parallel in an n− epitaxial layer on a heavy doped n+ semiconductor substrate, wherein the trenches each has a trench oxide layer formed on a bottom and sidewalls thereof;

a plurality of recesses formed in the n− epitaxial layer at mesas between the plurality of trenches, wherein the recesses each has a recess oxide layer formed on a bottom and sidewalls thereof and the recesses abutting the trench oxide layer of the trenches;

a first polysilicon layer doped with conductive impurities formed and filled in the plurality of trenches;

a second polysilicon layer doped with a conductive impurities formed and filled in the plurality of recesses;

a plurality of p type bodies formed in the n− epitaxial layer at the mesas, wherein said p type bodies each is interlaced with the recesses each along a longitudinal direction of the trenches;

a top metal layer formed on and contacted the first and second polysilicon layers and the mesas for serving as an anode, and a bottom metal layer formed beneath the heavy doped n+ semiconductor substrate for serving as a cathode.

5. The dual trench rectifier of claim 4, wherein the p bodies abutting the trench oxide layer of the trenches.

* * * * *